(12) United States Patent
Jo et al.

(10) Patent No.: US 10,991,555 B2
(45) Date of Patent: Apr. 27, 2021

(54) PLASMA PROCESSING DEVICE

(71) Applicant: Samsung Display Co., Ltd., Yongin-si (KR)

(72) Inventors: Soo Beom Jo, Yongin-si (KR); Hae Young Yoo, Yongin-si (KR); Ju Hee Lee, Yongin-si (KR); Yong Mun Chang, Yongin-si (KR); Myung Soo Huh, Yongin-si (KR)

(73) Assignee: Samsung Display Co., Ltd.

( * ) Notice: Subject to any disclaimer, the term of this patent is extended or adjusted under 35 U.S.C. 154(b) by 255 days.

(21) Appl. No.: 16/172,863

(22) Filed: Oct. 29, 2018

(65) Prior Publication Data
US 2019/0214233 A1    Jul. 11, 2019

(30) Foreign Application Priority Data
Jan. 9, 2018 (KR) .......................... 10-2018-0002803

(51) Int. Cl.
*H01J 37/32* (2006.01)
*H01L 21/3065* (2006.01)

(52) U.S. Cl.
CPC ...... *H01J 37/32238* (2013.01); *H01J 37/321* (2013.01); *H01J 37/3211* (2013.01); *H01J 37/3222* (2013.01); *H01J 37/3244* (2013.01); *H01J 37/32119* (2013.01); *H01J 37/32449* (2013.01); *H01J 37/32724* (2013.01); *H01J 37/32834* (2013.01); *H01L 21/3065* (2013.01)

(58) Field of Classification Search
CPC ............ H01L 21/3065; H01J 37/32119; H01J 37/3244; H01J 37/3222; H01J 37/321; H01J 37/3211; H01J 37/32449; H01J 37/32238; H01J 37/32834; H01J 37/32724

See application file for complete search history.

(56) References Cited

U.S. PATENT DOCUMENTS

| 5,980,686 | A | 11/1999 | Goto |
| 6,255,221 | B1 | 7/2001 | Hudson et al. |
| 2013/0228550 | A1 | 9/2013 | Mori et al. |
| 2016/0148822 | A1 | 5/2016 | Criminale et al. |

FOREIGN PATENT DOCUMENTS

| JP | 2014-179311 | 9/2014 |
| KR | 10-2001-0103417 | 11/2001 |
| KR | 10-0688229 | 2/2007 |
| KR | 10-2015-0009445 | 1/2015 |
| TW | 201309104 | 2/2013 |

OTHER PUBLICATIONS

Extended European Search Report dated Aug. 19, 2017, in European Patent Application No. 19150510.6.

*Primary Examiner* — Yuechuan Yu

(74) *Attorney, Agent, or Firm* — H.C. Park & Associates, PLC

(57) ABSTRACT

A plasma processing device including a chamber, a plurality of dielectric windows covering a top portion of the chamber, a lid frame supporting the dielectric windows on a same plane, a plurality of supporting bars supporting a top portion of the lid frame, and a plurality of antennas positioned above the dielectric windows, in which the antennas include a first antenna positioned inside an area defined by the supporting bars and having a loop form, and a second antenna positioned outside the area defined by the supporting bars and having a loop form, and a first current direction in the first antenna and a second current direction in the second antenna are the same as each other.

22 Claims, 9 Drawing Sheets

PLASMA PROCESSING DEVICE

CROSS-REFERENCE TO RELATED APPLICATION

This application claims priority from and the benefit of Korean patent application 10-2018-0002803, filed on Jan. 9, 2018, which is hereby incorporated by reference for all purposes as if full set forth herein.

BACKGROUND

Field

Exemplary embodiments of the invention relate generally to a plasma processing device, and, more specifically, to a plasma processing device capable of performing a uniform plasma process.

Discussion of the Background

A plasma processing device is generally used in a plasma process for dry etching, film formation, and the like, during a manufacturing of a liquid crystal display (LCD), an organic light emitting display (OLED), and the like.

In recent years, a plurality of display devices may be simultaneously processed on a target substrate having a large area to reduce manufacturing costs thereof. Furthermore, with the advancement of technology, the size of the target substrate has been increasing.

However, as a chamber of the plasma processing device for accommodating the target substrate has also become larger, it is difficult to achieve uniform characteristics in the chamber, such as internal electromagnetic field, temperature, gas flow, and the like.

The above information disclosed in this Background section is only for understanding of the background of the inventive concepts, and, therefore, it may contain information that does not constitute prior art.

SUMMARY

Devices constructed according to exemplary embodiments of the invention are capable of performing a uniform plasma process on a target substrate having a large area.

Additional features of the inventive concepts will be set forth in the description which follows, and in part will be apparent from the description, or may be learned by practice of the inventive concepts.

A plasma processing device according to an exemplary embodiment includes a chamber, a plurality of dielectric windows covering a top portion of the chamber, a lid frame supporting the dielectric windows on a same plane, a plurality of supporting bars supporting a top portion of the lid frame, and a plurality of antennas positioned above the dielectric windows, in which the antennas include a first antenna positioned inside an area defined by the supporting bars and having a loop form, and a second antenna positioned outside the area defined by the supporting bars and having a loop form, and a first current direction in the first antenna and a second current direction in the second antenna are the same as each other.

The first current direction and the second current direction may be clockwise.

The first current direction and the second current direction may be counterclockwise.

The antennas may further include a third antenna positioned inside the first antenna and having a loop form.

A third current direction in the third antenna may be different from the first current direction.

The antennas may further include a fourth antenna positioned outside the second antenna and having a loop form.

A fourth current direction in the fourth antenna may be different from the second current direction.

The plasma processing device may further include a plurality of exhaust ports positioned at a bottom portion of the chamber, and a plurality of first injection nozzles positioned vertically adjacent to the exhaust ports at the top portion of the chamber.

The first injection nozzles may be grouped, each group connected to the same injection channel, and each group of the first injection nozzles may correspond to each of the exhaust ports.

The plasma processing device may further include a plurality of injection nozzles positioned at a portion of the dielectric windows.

The injection nozzles may include a plurality of first injection nozzles positioned at a plurality of first dielectric windows positioned at an outermost edge of the dielectric windows.

The injection nozzles may include a plurality of second injection nozzles positioned at a plurality of second dielectric windows positioned adjacent to a center portion of the chamber.

The first injection nozzles may be arranged in a loop form along an array of the first dielectric windows.

The second injection nozzles may be arranged along at least two parallel straight lines.

The plasma processing device may further include a plurality of exhaust ports positioned at the chamber, and a target substrate positioned inside the exhaust ports in a plan view.

The target substrate may include a using area and a non-using area, and an opening ratio of a first exhaust port adjacent to the non-using area is greater than an opening ratio of a second exhaust port adjacent to the using area.

The second exhaust port may be positioned at an inner corner adjacent to the using area, among a plurality of inner corners of the chamber.

The plasma processing device may further include a target substrate and a plurality of cooling channels positioned between a bottom wall of the chamber and the target substrate.

The cooling channels may include an inner circulation channel, and an outer circulation channel positioned outside the inner circulation channel.

A temperature of an inner cooling fluid flowing into the inner circulation channel may be higher than a temperature of an outer cooling fluid flowing into the outer circulation channel.

An inlet port of the inner circulation channel and an inlet port of the outer circulation channel may be positioned in a concentrated area of the inner circulation channel.

An outermost corner of the outer circulation channel may have a diameter greater than an average diameter of remaining portions of the outer circulation channel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
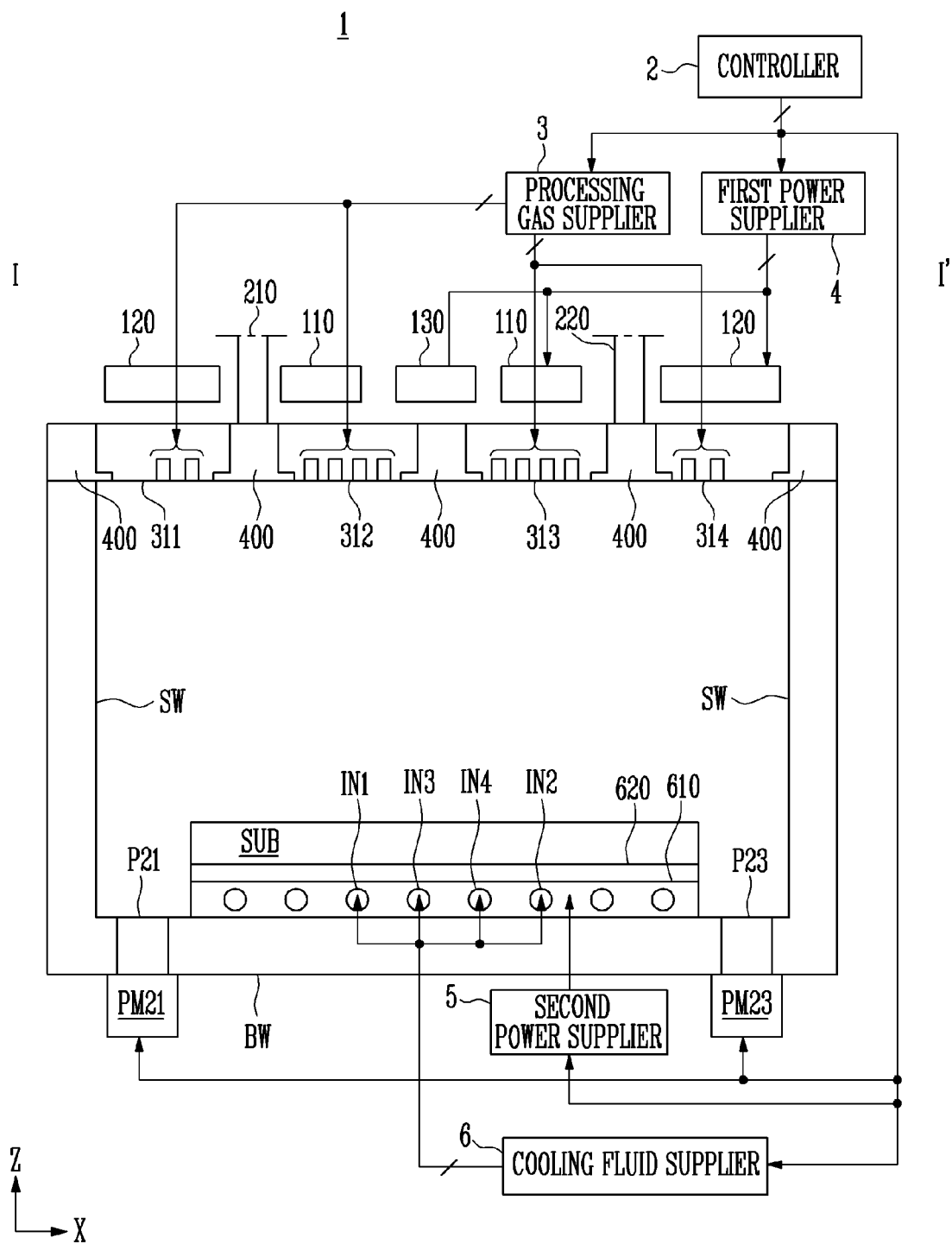
FIG. 1 is a view of a plasma processing device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, exemplary embodiments are described in detail with reference to the accompanying drawings so that those skilled in the art may easily practice the present disclosure. The present disclosure may be implemented in various different forms and is not limited to the exemplary embodiments described in the present specification.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and areas are exaggerated for clear expressions.

FIG. 1 is a view of a plasma processing device according to an exemplary embodiment.

Referring to FIG. 1, a plasma processing device 1 according to an exemplary embodiment includes a controller 2, a processing gas supplier 3, a first power supplier 4, a second power supplier 5, a cooling fluid supplier 6, a plurality of antennas 110, 120, and 130, a plurality of dielectric windows 311, 312, 313, and 314, a lid frame 400, a plurality of supporting bars 210 and 220, an electrostatic chuck 620, a bottom electrode 610, a plurality of exhaust ports P21 and P23, and a plurality of exhaust pumps PM21 and PM23. A target substrate SUB may be positioned on the electrostatic chuck 620 of the plasma processing device 1 (or chamber) depending on a processing state.

As used herein, a chamber may refer to a space formed by a bottom wall BW, side walls SW, and the plurality of dielectric windows 311, 312, 313, and 314. The plurality of dielectric windows 311, 312, 313, and 314 cover a top portion of the chamber.

The dielectric windows 311, 312, 313, and 314 may include dielectric materials for passing electromagnetic fields generated from the antennas 110, 120, and 130. The dielectric materials may include ceramics or the like.

The bottom wall BW and the side walls SW of the plasma processing device 1 may include conductors so that the electromagnetic fields may not be transmitted to the outside. More specifically, the bottom wall BW and the side walls SW may have a structure of conductors coated with a coating film, which is an insulator. For example, the bottom wall BW and the side walls SW may include aluminum (Al) coated with a coating film including aluminum oxide ($Al_2O_3$).

When an upper wall of the chamber is formed as a single large dielectric window, such upper wall may be improper due to its weight and/or material limitations. Accordingly, an upper wall of the chamber according to an exemplary embodiment may include dielectric windows 311, 312, 313, and 314 supported by the lid frame 400. The lid frame 400 may support the dielectric windows 311, 312, 313, and 314 on the same plane. For example, the lid frame 400 may include aluminum (Al) coated with a coating film including aluminum oxide ($Al_2O_3$). In addition, the lid frame 400 may include a light and rigid material.

The supporting bars 210 and 220 support a top portion of the lid frame 400. Although the lid frame 400 supports the of dielectric windows 311, 312, 313, and 314 on the same plane, there is a risk that a center portion of the dielectric windows 311, 312, 313, and 314 may collapse due to the weight thereof. Therefore, the supporting bars 210 and 220 may support the lid frame 400 and the dielectric windows 311, 312, 313, and 314 in an upward direction by connecting the top portion of the lid frame 400 and a ceiling wall.

The antennas 110, 120, and 130 are positioned above the dielectric windows 311, 312, 313, and 314. The antennas 110, 120, and 130 may generate electromagnetic fields corresponding to powers supplied from the first power supplier 4, under the control of the controller 2. The antennas 110, 120, and 130 will be described in more detail below with reference to FIGS. 2 and 3.

Figure 4:
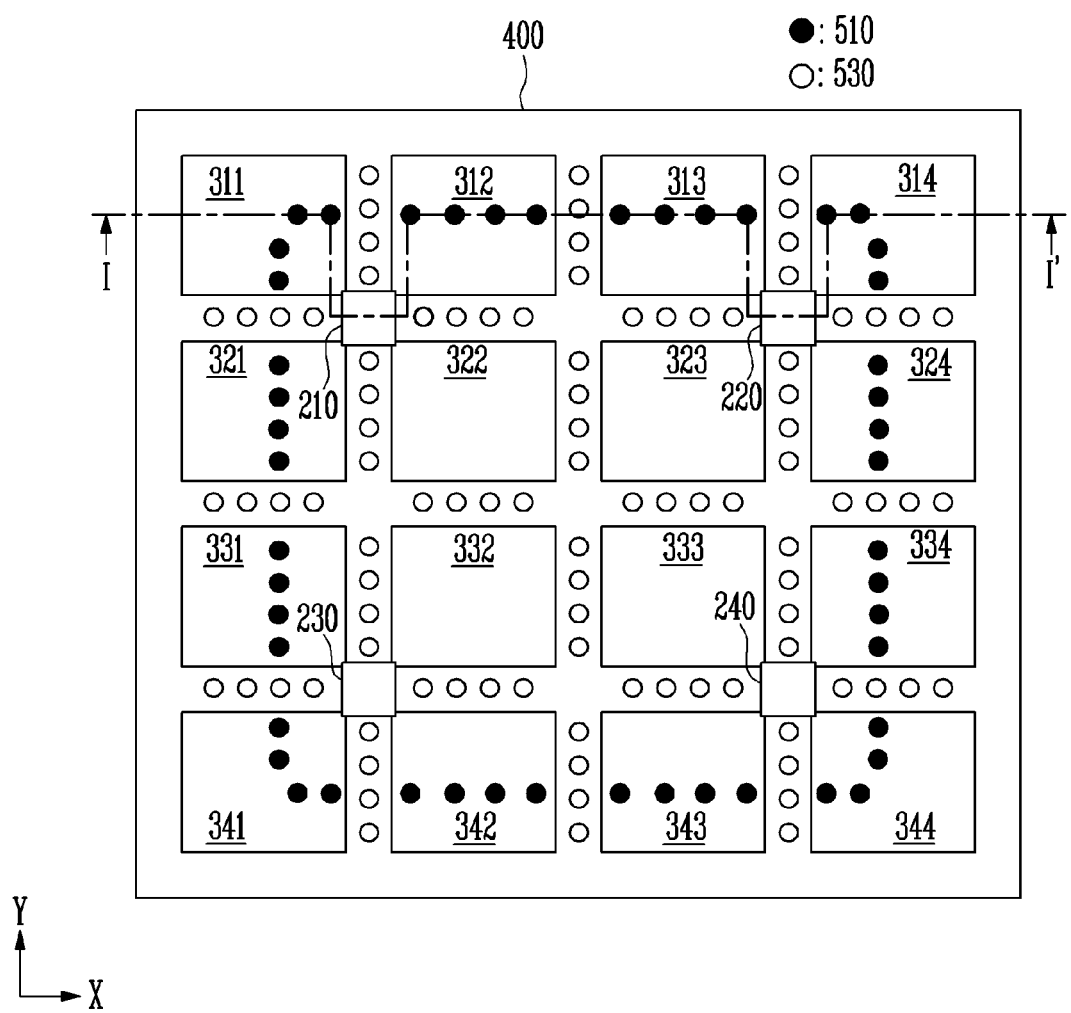
FIG. 4 is a view of a plurality of injection nozzles according to an exemplary embodiment.

According to an exemplary embodiment, the dielectric windows 311, 312, 313, and 314 may include a plurality of injection nozzles (see FIG. 4). The processing gas supplier 3 is controlled by the controller 2 to supply a processing gas to a target injection nozzle.

The electrostatic chuck 620 may charge the target substrate SUB using a supplied DC voltage, and fix the target substrate SUB using the charged potential. The bottom electrode 610 may be supplied with a bias power from the second power supplier 5 under the control of the controller 2 to form a self-bias. Thus, plasma ions in the chamber may be effectively introduced into the target substrate SUB.

A plurality of cooling channels may be formed at the bottom electrode 610 or adjacent thereto. In FIG. 1, inlet ports IN1, IN2, IN3, and IN4 of the cooling channels are shown. The cooling fluid supplier 6 may supply a cooling fluid in a liquid or gas state to the inlet ports IN1, IN2, IN3, and IN4 of the cooling channels under the control of the controller 2. The cooling channels will be described in detail below with reference to FIGS. 8 and 9.

The exhaust ports P21 and P23 may be positioned at a bottom portion of the chamber. For example, the exhaust ports P21 and P23 may be positioned at the bottom wall BW adjacent to the side walls SW. That is, the exhaust ports P21 and P23 may be positioned at bottom edges of the chamber to maximize the space for accommodating the target substrate SUB. In addition, the exhaust pumps PM21 and PM23 may be positioned under the exhaust ports P21 and P23, respectively. The exhaust pumps PM21 and PM23 may be controlled by the controller 2 to adjust opening ratios of the corresponding exhaust ports P21 and P23, respectively. As such, the controller 2 may control a gas flow in the chamber through the exhaust ports P21 and P23 and the exhaust pumps PM21 and PM23, respectively, or maintain a vacuum atmosphere in the chamber.

A cross-sectional view of the plasma processing device 1 shown in FIG. 1 is illustrated with respect to a first plan direction X and a vertical direction Z. However, the cross-sectional view of FIG. 1 taken along I-I' is intended to help understanding of the plasma processing device 1, and thus, cross-sectional view of the layers described below may not coincide with each other. In FIGS. 2 to 9 described below, plan views are illustrated on the basis of the first plan direction X and a second plan direction Y perpendicular to the first plan direction X. The upper and lower portions refer to the second plan direction Y, and the top and bottom portions refer to the vertical direction Z.

Figure 2:
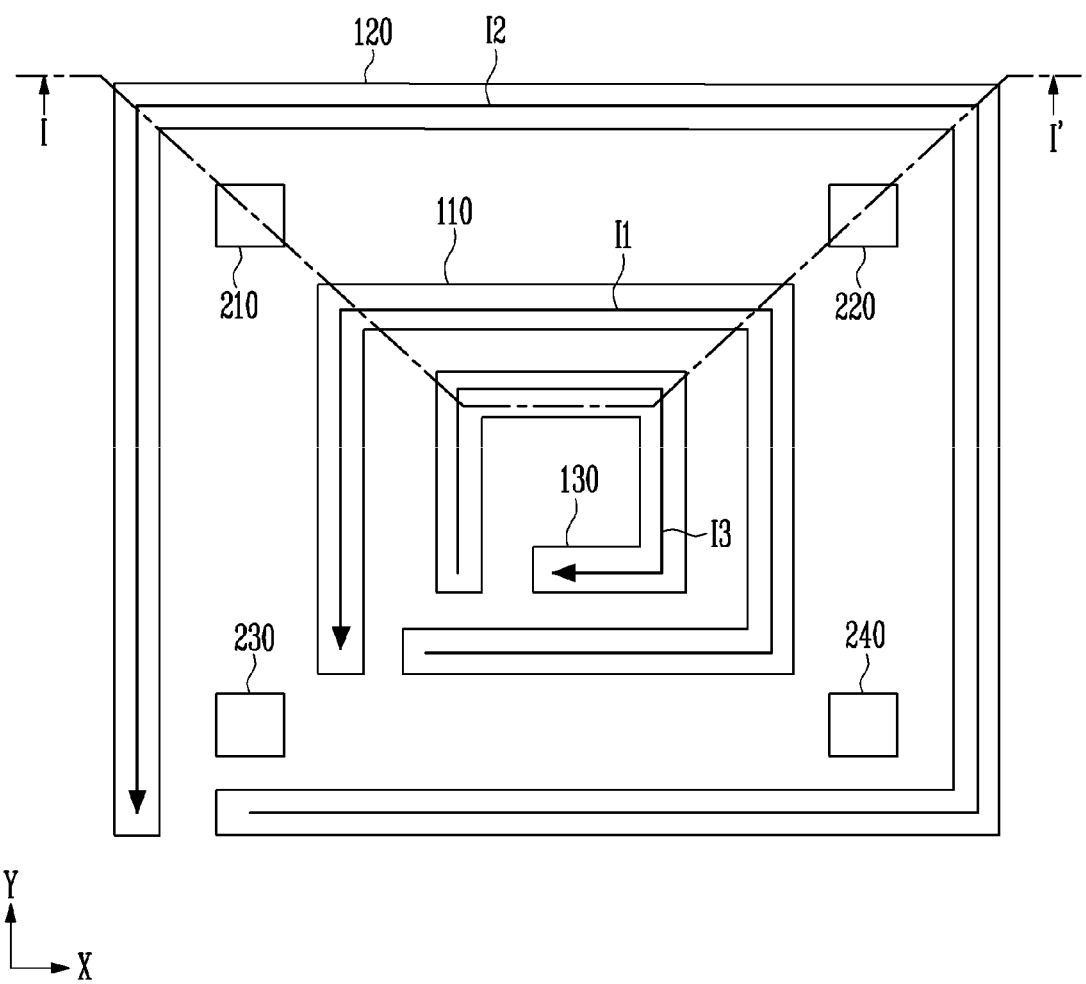
FIG. 2 is a view of a plurality of antennas according to an exemplary embodiment.

FIG. 2 is a view of a plurality of antennas according to an exemplary embodiment. Referring to FIG. 2, the antennas 110, 120, and 130 and supporting bars 210, 220, 230, and 240 are formed in a plasma processing device according to an exemplary embodiment.

The first antenna 110 may be positioned above the dielectric windows 311, 312, 313, and 314 and have a loop form. For example, the first antenna 110 may be positioned inside an area defined by the supporting bars 210, 220, 230, and 240 as corners.

The second antenna 120 may be positioned to interpose the supporting bars 210, 220, 230, and 240 with the first antenna 110 above the dielectric windows 311, 312, 313, and 314, and may have a loop form. For example, the second antenna 120 may be positioned outside the area defined by the supporting bars 210, 220, 230, and 240 as the corners.

As described above, the supporting bars 210, 220, 230, and 240 are provided to prevent the collapse of the dielectric windows 311, 312, 313, and 314 and the lid frame 400. However, since the supporting bars 210, 220, 230, and 240 and the antennas 110, 120, and 130 are disposed on the same plane, a dead zone may be formed in areas where antennas cannot be formed. As used herein, the dead zone may refer to an area connecting the supporting bars 210, 220, 230, and 240 at the shortest distance.

The first power supplier 4 may cause currents to flow at the antennas 110, 120, and 130 to supply electromagnetic fields to the chamber through the dielectric windows 311, 312, 313, and 314 to form plasma. However, since the antennas cannot be positioned in the dead zone, there may be some areas where the electromagnetic fields are weakened than other areas. Furthermore, when the supporting bars 210, 220, 230, and 240 include conductors, the supporting bars 210, 220, 230 and 240 may block the electromagnetic fields in the vicinity.

According to an exemplary embodiment, a first current direction I1 in the first antenna 110 and a second current direction I2 in the second antenna 120 are formed to be identical to each other. As used herein, a current direction may refer to a direction of a current flowing into the corresponding antenna. In this manner, the electromagnetic fields generated by the first antenna 110 and the second antenna 120 may resonate with each other, so that the electromagnetic fields in the dead zone, where the supporting bars 210, 220, 230, and 240 are formed, may be strengthened.

In FIG. 2, all of the first current direction I1 and the second current direction I2 are formed in a counterclockwise direction. However, in other exemplary embodiments, all of the first current direction I1 and the second current direction I2 may be in a clockwise direction.

The third antenna 130 may be positioned inside the first antenna 110 above the dielectric windows 311, 312, 313, and 314, and may have a loop form. A third current direction I3 in the third antenna 130 may be different from the first current direction I1. The third current direction I3 is clockwise as shown in FIG. 2. Since there is no supporting bar between the first antenna 110 and the third antenna 130, the above-described resonance may have little effect. Therefore, the third antenna 130 and the first antenna 110 may have different current directions for an efficient electromagnetic field distribution.

Although each of the antennas 110, 120, and 130 has a loop form with angled corners as shown in FIG. 2, the inventive concepts are not limited thereto. For example, according to other exemplary embodiments, the antennas 110, 120, and 130 may form a loop having a substantially a circular shape with no corners. The forms of the antennas 110, 120, and I3 shown in FIG. 2 are simplified to easily explain the current directions of the respective antennas 110, 120 and 130. However, antennas may further include branch antennas extending from the antennas 110, 120, and 130 in consideration of the distribution of electromagnetic fields in the chamber. Furthermore, each of the antennas 110, 120, and 130 may have a form of multiple loops. Thus, at least some portions of the antennas 110, 120, and 130 may not have the current directions show in FIG. 2, but may generally have the current directions as shown in FIG. 2. The above-description may also be applicable to the antennas of other exemplary embodiments which will be described below.

Figure 3:
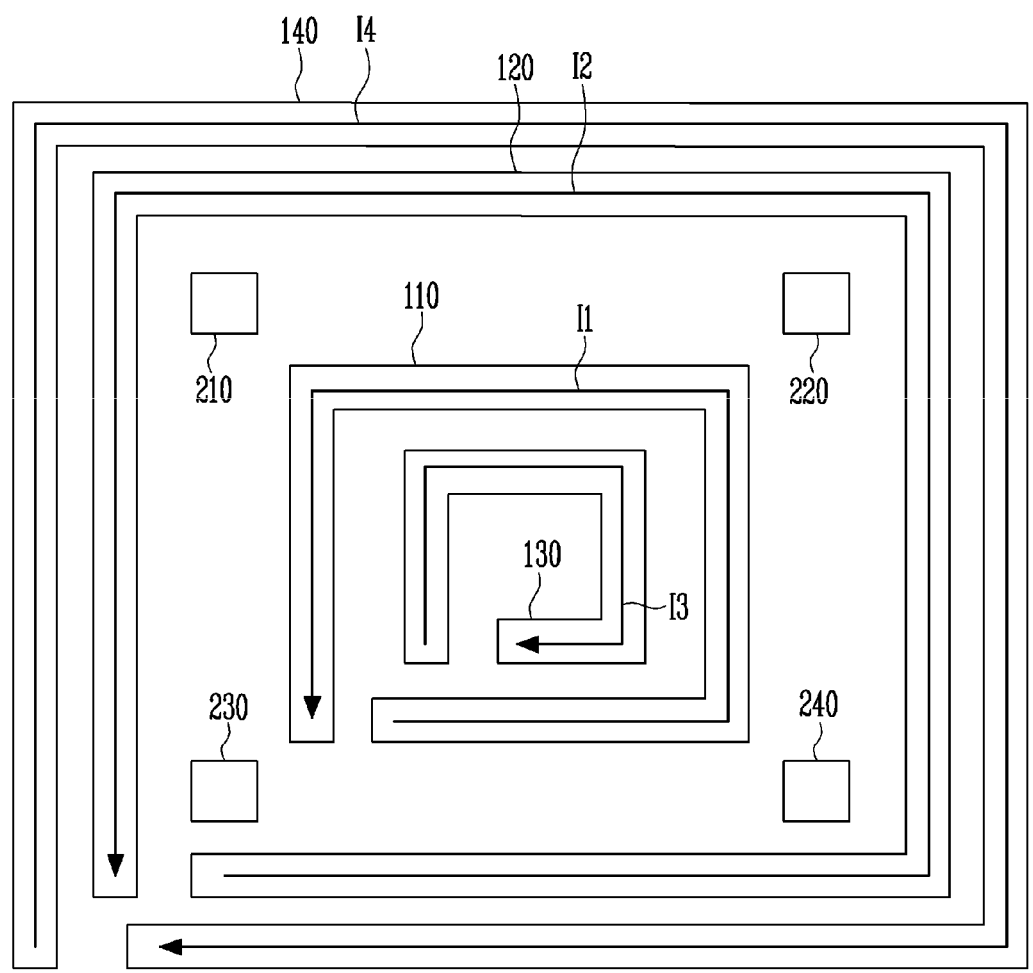
FIG. 3 is a view of a plurality of antennas according to another exemplary embodiment.

FIG. 3 is a view of a plurality of antennas according to another exemplary embodiment.

Referring to FIG. 3, a plurality of antennas 110, 120, 130, and 140 and supporting bars 210, 220, 230, and 240 may be formed in a plasma processing device according to an exemplary embodiment. The plasma processing device shown in FIG. 3 is different from that of FIG. 2, in that the fourth antenna 140 is further formed therein.

The fourth antenna 140 may be positioned outside the second antenna 120 above the dielectric windows 311, 312, 313, and 314, and may have a loop form. A fourth current direction I4 in the fourth antenna 140 may be different from the second current direction I2. The fourth current direction I4 is clockwise as shown in FIG. 3. Since there is no supporting bar between the fourth antenna 140 and the second antenna 120, the above-described resonance may have little effect. Therefore, the fourth antenna 140 and the second antenna 120 may have different current directions for an efficient electromagnetic field distribution.

FIG. 4 is a view of a plurality of injection nozzles according to an exemplary embodiment. The injection nozzles may supply a processing gas from the processing gas supplier 3 to the chamber under the control of the controller 2.

Referring to FIG. 4, the lid frame 400, the supporting bars 210, 220, 230, and 240, a plurality of dielectric windows 311, 312, 313, 314, 321, 322, 323, 324, 331, 332, 333, 334, 341, 342, 343, and 344, and a plurality of injection nozzles 510 and 530 may be formed in a plasma processing device according to an exemplary embodiment.

The plasma processing device according to an exemplary embodiment may have a plurality of third injection nozzles 530 positioned at the lid frame 400. The plasma processing device according to the illustrated exemplary embodiment may have a plurality of first injection nozzles 510 positioned at a plurality of first dielectric windows 311, 312, 313, 314, 321, 324, 331, 334, 341, 342, 343, and 344, which are positioned at the outermost edge of the windows 311, 312, 313, 314, 321, 322, 323, 324, 331, 332, 333, 334, 341, 342, 343, and 344. The first injection nozzles 510 may be arranged in a loop form along an array of the first dielectric windows 311, 312, 313, 314, 321, 324, 331, 334, 341, 342, 343, and 344.

As described above, the exhaust ports P21 and P23 may be positioned at the bottom edge of the chamber to maximize the space for accommodating the target substrate SUB. Thus, the gas flow inside the chamber may be the fastest at the bottom edge of the chamber where the exhaust ports P21 and P23 are located. The first injection nozzles 510 according to an exemplary embodiment may be positioned vertically adjacent to the exhaust ports P21 and P23 at a top portion of the chamber. Accordingly, the first injection nozzles 510 may reduce the difference in the gas flow rate between the center portion and the edge portion of the chamber by increasing the injection amount of the processing gas per time at the edge portion of the chamber.

According to an exemplary embodiment, the first injection nozzles 510 are grouped, and each group is connected to an identical injection channel. In addition, each group of the first injection nozzles 510 corresponds to positions of the exhaust ports P21 and P23. In addition, in the following descriptions, the third injection nozzles 530 may further be added to each group.

Figure 6:
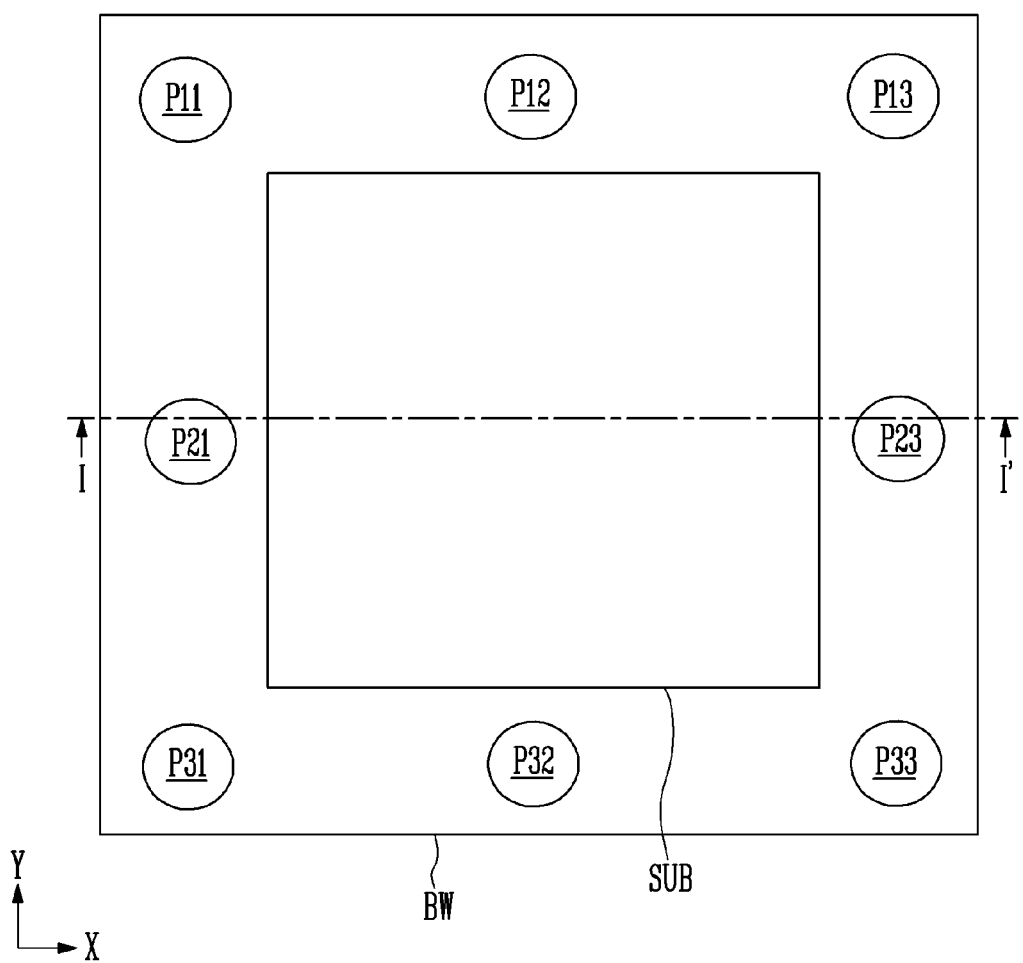
FIG. 6 is a view of a plurality of exhaust ports according to an exemplary embodiment.

For example, referring to FIGS. 4 and 6, the first injection nozzles 510 positioned at the first dielectric window 311 closest to the exhaust port P11 and the third injection nozzles 530 positioned at a portion of the lid frame 400 supporting the first dielectric window 311 (e.g., a portion of the lid frame 400 disposed between the first dielectric windows 311 and 321, and a portion of the lid frame 400 disposed between the first dielectric windows 311 and 321) may be connected to the same injection channel, so that the injection amount of the processing gas may be adjusted according to the opening ratio of the exhaust port P11. For example, when the opening ratio of the exhaust port P11 increases, the processing gas injection amount may also be increased, and when the opening ratio of the exhaust port P11 decreases, the process gas injection amount may also be decreased.

Furthermore, the first injection nozzles 510 positioned at the first dielectric windows 312 and 313 closest to the exhaust port P12 and the third injection nozzles 530 positioned at a portion of the lid frame 400 between the first dielectric windows 312 and 313 may be connected to the same injection channel, so that the injection amount of the processing gas may be adjusted according to the opening ratio of the exhaust port P12. For example, when the opening ratio of the exhaust port P12 increases, the processing gas injection amount may also be increased, and when the opening ratio of the exhaust port P12 decreases, the process gas injection amount may also be decreased.

Furthermore, the first injection nozzles 510 positioned at the first dielectric window 314 closest to the exhaust port P13 and the third injection nozzles 530 positioned at a portion of the lid frame 400 supporting the first dielectric window 314 (e.g., a portion of the lid frame 400 disposed between the first dielectric windows 313 and 314, and a portion of the lid frame 400 disposed between the first dielectric windows 314 and 324) may be connected to the same injection channel, so that the injection amount of the processing gas may be adjusted according to the opening ratio of the exhaust port P13. For example, when the opening ratio of the exhaust port P13 increases, the processing gas injection amount may also be increased, and when the opening ratio of the exhaust port P13 decreases, the process gas injection amount may also be decreased.

Furthermore, the first injection nozzles 510 positioned at the first dielectric windows 324 and 334 closest to the exhaust port P23 and the third injection nozzles 530 positioned at a portion of the lid frame 400 between the first dielectric windows 324 and 334 may be connected to the same injection channel, so that the injection amount of processing gas may be adjusted according to the opening ratio of the exhaust port P23. For example, when the opening ratio of the exhaust port P23 increases, the processing gas injection amount may also be increased, and when the opening ratio of the exhaust port P23 decreases, the process gas injection amount may also be decreased.

Furthermore, the first injection nozzles 510 positioned at the first dielectric window 344 closest to the exhaust port P33 and the third injection nozzles 530 positioned at a portion of the lid frame 400 supporting the first dielectric window 344 (e.g., a portion of the lid frame 400 disposed between the first dielectric windows 334 and 344, and a portion of the lid frame 400 disposed between the first dielectric windows 344 and 343) may be connected to the same injection channel, so that the injection amount of the processing gas may be adjusted according to the opening ratio of the exhaust port P33. For example, when the opening ratio of the exhaust port P33 increases, the processing gas injection amount may also be increased, and when the opening ratio of the exhaust port P33 decreases, the process gas injection amount may also be decreased.

Furthermore, the first injection nozzles 510 positioned at the first dielectric windows 342 and 343 closest to the exhaust port P32 and the third injection nozzles 530 positioned at a portion of the lid frame 400 between the first dielectric windows 342 and 343 may be connected to the same injection channel, so that the injection amount of the processing gas may be adjusted according to the opening ratio of the exhaust port P32. For example, when the opening ratio of the exhaust port P32 increases, the processing gas injection amount may also be increased, and when the opening ratio of the exhaust port P32 decreases, the process gas injection amount can also be decreased.

Furthermore, the first injection nozzles 510 positioned at the first dielectric window 341 closest to the exhaust port P31 and the third injection nozzles 530 positioned at a portion of the lid frame 400 supporting the first dielectric window 341 (e.g., a portion of the lid frame 400 disposed between the first dielectric windows 342 and 341, and a portion of the lid frame 400 disposed between the first dielectric windows 341 and 331) may be connected to the same injection channel, so that the injection amount of the processing gas may be adjusted according to the opening ratio of the exhaust port P31. For example, when the opening ratio of the exhaust port P31 increases, the processing gas injection amount may also be increased, and when the opening ratio of the exhaust port P31 decreases, the process gas injection amount may also be decreased.

Furthermore, the first injection nozzles 510 positioned at the first dielectric windows 321 and 331 closest to the exhaust port P21 and the third injection nozzles 530 positioned at a portion of the lid frame 400 between the first dielectric windows 321 and 331 may be connected to the same injection channel, so that the injection amount of the processing gas may be adjusted according to the opening ratio of the exhaust port P21. For example, when the opening ratio of the exhaust port P21 increases, the processing gas injection amount may also be increased, and when the opening ratio of the exhaust port P21 decreases, the process gas injection amount may also be decreased.

For example, the remaining third injection nozzles 530 positioned at portions of the lid frame 400 supporting the dielectric windows 322, 323, 332, and 333 may be connected to the same injection channel. For another example, the remaining third injection nozzles 530 positioned at portions of the lid frame 400 supporting the dielectric windows 322, 323, 332, and 333 may be grouped depending on a distance from the center of the lid frame 400, and each group may be connected to each injection channel.

According to the above exemplary embodiment, the processing gas injection amount of each injection channel may correspond to the individual opening ratios of the exhaust ports P11, P12, P13, P21, P23, P31, P32 and P33, so that the difference in the gas flow rates may be more effectively alleviated.

Figure 5:
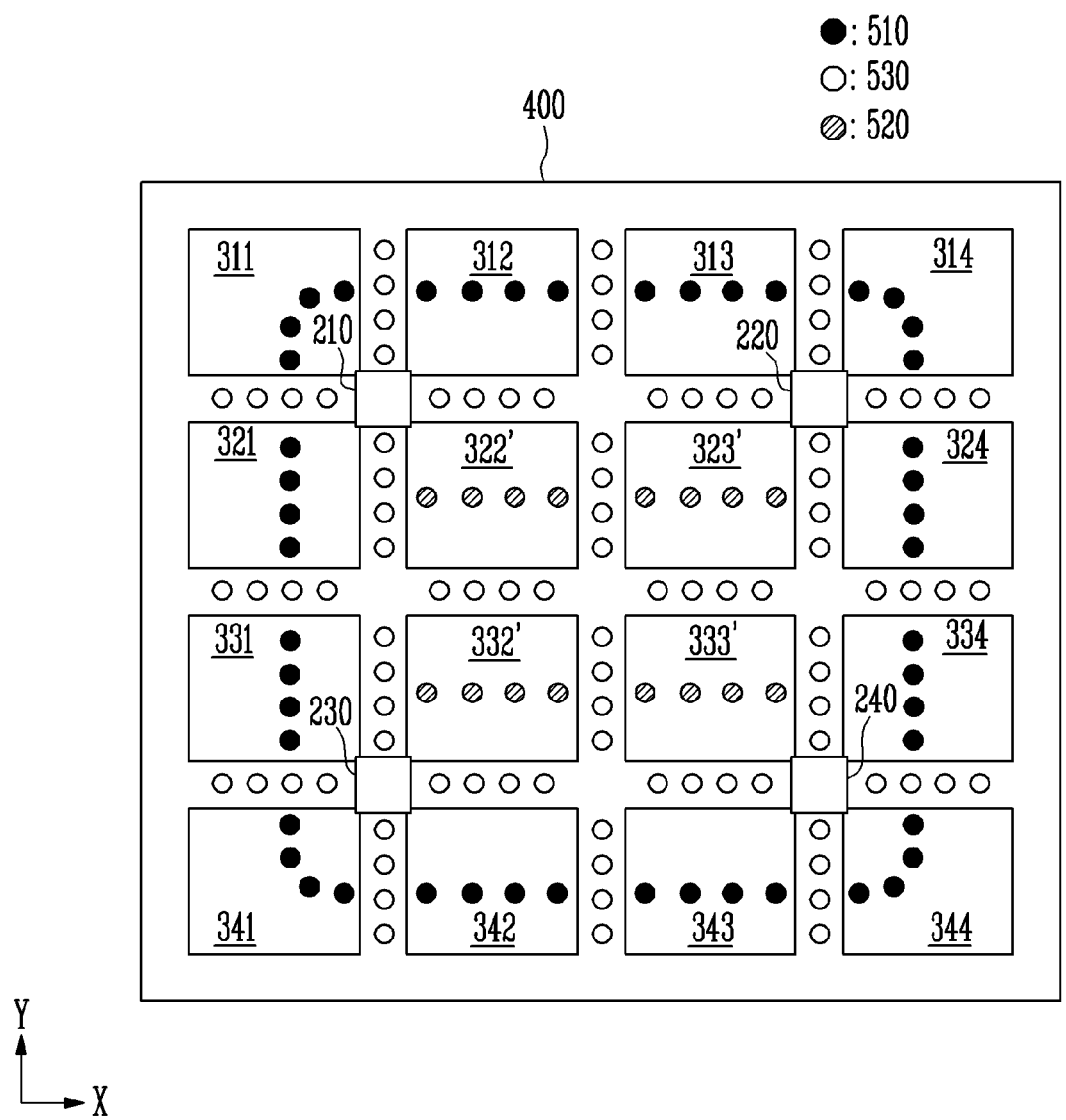
FIG. 5 is a view of a plurality of injection nozzles according to another exemplary embodiment.

FIG. 5 is a view of a plurality of injection nozzles according to another exemplary embodiment.

Referring to FIG. 5, the lid frame 400, the supporting bars 210, 220, 230, and 240, a plurality of dielectric windows 311, 312, 313, 314, 321, 322', 323', 324, 331, 332', 333', 334, 341, 342, 343, and 344, and a plurality of injection nozzles 510, 520, and 530 may be formed in a plasma processing device according to an exemplary embodiment.

The plasma processing device of FIG. 5 further includes a plurality of second injection nozzles 520, as compared to that in FIG. 4. The second injection nozzles 520 may be positioned at a plurality of second dielectric windows 322', 323', 332', and 333' positioned around a center portion, which may refer to a center portion among the dielectric windows 311, 312, 313, 314, 321, 322', 323', 324, 331, 332', 333', 334, 341, 342, 343, and 344, or may refer to a center portion of the lid frame 400.

The second injection nozzles 520 may be arranged along at least two parallel straight lines and be formed on the second dielectric windows 322', 323', 332', and 333'. For example, the second injection nozzles 520 may be arranged in the first plan direction X, as shown in FIG. 5.

According to an exemplary embodiment, the second injection nozzles 520 may adjust the processing gas injection speed in the center portion, which has a slower gas flow rate due to the absence of the exhaust port. In this manner, the difference in the gas flow rates in areas of the chamber may be alleviated.

The second injection nozzles 520 positioned in the first plan direction X may be grouped to be connected to the same injection channel, so that a gas flow distribution may be efficiently improved. For example, the second injection nozzles 520 positioned at the second dielectric windows 322' and 323' may be grouped and connected to the same injection channel, and the second injection nozzles 520 positioned at the second dielectric windows 332' and 333' may be grouped and connected to the same injection channel.

FIG. 6 is a view of a plurality of exhaust ports according to an exemplary embodiment.

Referring to FIG. 6, a plurality of exhaust ports P11, P12, P13, P21, P23, P31, P32, and P33 may be positioned at the bottom wall BW in the chamber.

The target substrate SUB may be positioned inside the exhaust ports P11, P12, P13, P21, P23, P31, P32, and P33 in a plan view, depending on the processing state of the plasma processing device 1.

The exhaust ports P11, P13, P31 and P33 may be positioned at corners of the bottom portion of the chamber, and the exhaust ports P12, P23, P32 and P21 may be positioned between the corners of the bottom portion of the chamber.

Figure 7:
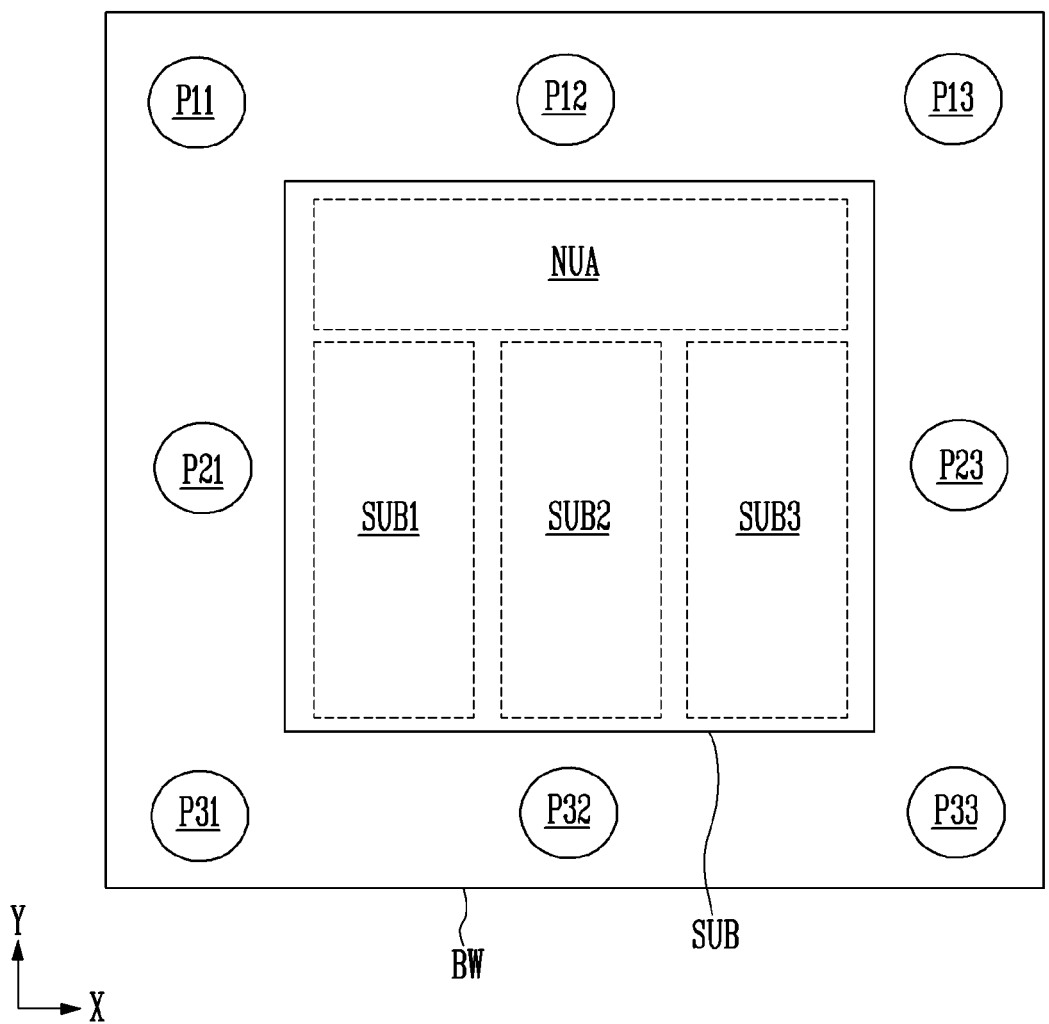
FIG. 7 is a view illustrating opening ratios of the plurality of exhaust ports depending on a target substrate according to an exemplary embodiment.

FIG. 7 is a view illustrating opening ratios of the plurality of exhaust ports depending on a target substrate according to an exemplary embodiment.

Referring to FIG. 7, the target substrate SUB may include using areas SUB1, SUB2, and SUB3, and a non-using area NUA.

An opening ratio of a first exhaust port adjacent to the non-using area NUA may be greater than an opening ratio of a second exhaust port adjacent to the using areas SUB1, SUB2, and SUB3, among the exhaust ports P11, P12, P13, P21, P23, P31, P32, and P33.

Therefore, the gas flow distribution in the using areas SUB1, SUB2, and SUB3 may be relatively uniform, and the gas flow rate in the non-using area NUA may be accelerated to perform the exhaust process. Although the gas flow distribution in the non-using area NUA may become uneven, such uneven gas flow distribution may be ignored as display devices are not formed in the non-using area NUA.

According to an exemplary embodiment, the first exhaust port adjacent to the non-using area NUA may be the exhaust ports P11, P12, and P13. Also, the second exhaust port adjacent to the using areas SUB1, SUB2, and SUB3 may be the exhaust ports P21, P23, P31, P32, and P33.

According to another exemplary embodiment, when the opening ratios of the exhaust ports P31 and P33 positioned at the bottom corners of the chamber are set to 0 (closed), among the second exhaust ports, improved gas flow distribution and exhaust rates may be achieved. That is, the second exhaust ports P31 and P33 may be positioned at the bottom corners adjacent to the using areas SUB1, SUB2, and SUB3, among the bottom corners of the chamber.

Figure 8:
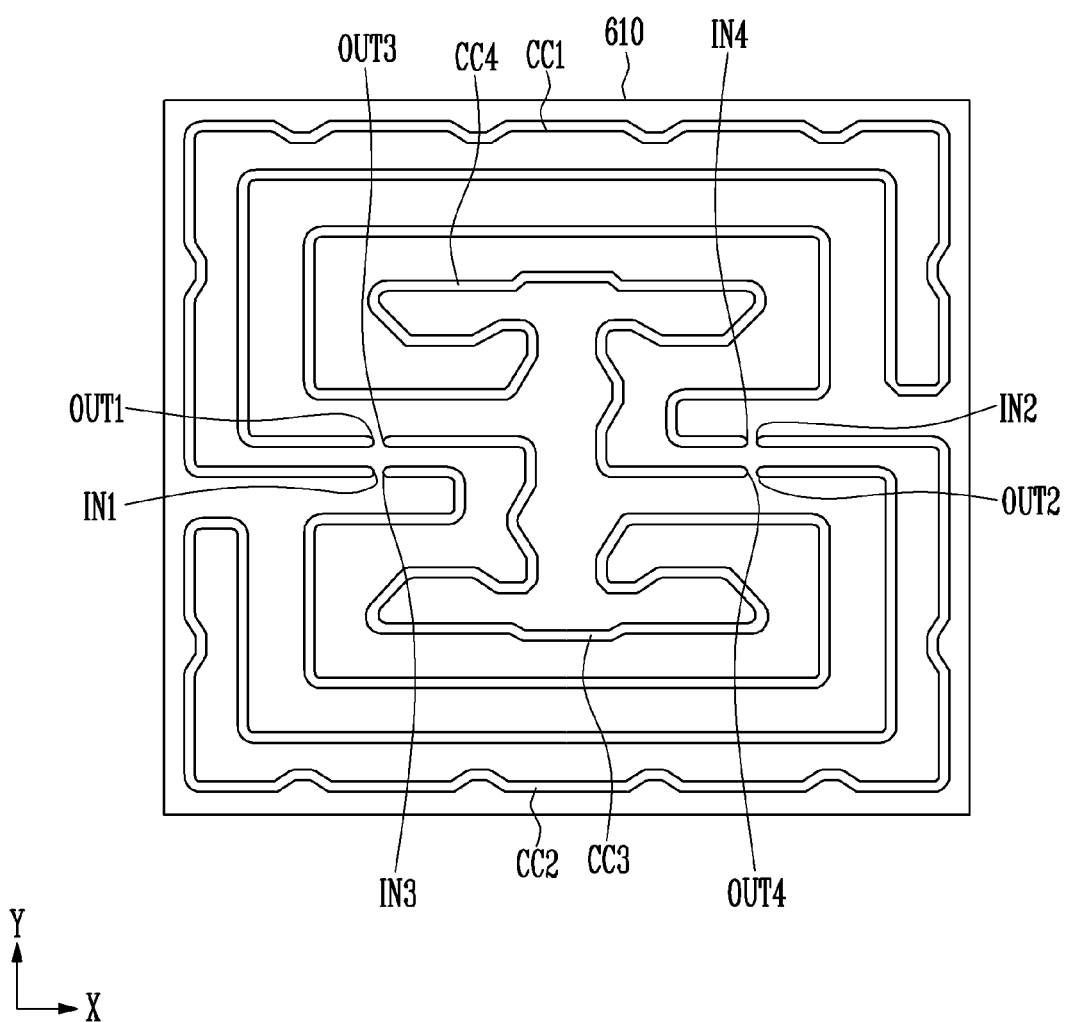
FIG. 8 is a view illustrating a plurality of cooling channels according to an exemplary embodiment.

FIG. 8 is a view of a plurality of cooling channels according to an exemplary embodiment.

According to an exemplary embodiment, a plurality of cooling channels may be positioned between the bottom wall BW of the chamber and the target substrate SUB. In FIGS. 1 and 8, the cooling channels are illustrated as being positioned at the bottom electrode 610, but the inventive concepts are not limited thereto, and the cooling channels may be formed at different elements or layers other than the bottom electrode 610.

The cooling channels may include an inner circulation channel and an outer circulation channel positioned outside the inner circulation channel. More particularly, referring to FIG. 8, the outer circulation channel may include a first outer circulation channel CC1 having a first inlet port IN1 and a first outlet port OUT1, and a second outer circulation channel CC2 having a second inlet port IN2 and a second outlet port OUT2. The first outer circulation channel CC1 may cool the upper portion, and the second outer circulating channel CC2 may cool the lower portion.

The inner circulation channel may include a first inner circulation channel CC3 having a third inlet port IN3 and a third outlet port OUT3, and a second inner circulation channel CC4 having a fourth inlet port IN4 and a fourth outlet port OUT4. The first inner circulation channel CC3 may cool the lower portion, and the second inner circulating channel CC4 may cool the upper portion.

According to an exemplary embodiment, temperatures of inner cooling fluids flowing into the inner circulation channels CC3 and CC4 may be higher than temperatures of outer cooling fluids flowing into the outer circulation channels CC1 and CC2. The cooling fluids may be a liquid or gas.

The temperature configuration of the cooling fluids may be related to the density of the cooling channels. According to an exemplary embodiment, the cooling channels may be concentrated at the center portion. Furthermore, according to an exemplary embodiment, the inlet ports IN3 and IN4 of the inner circulation channels CC3 and CC4 and the inlet ports IN1 and IN2 of the outer circulation channels CC1 and CC2 may be positioned adjacent to each other, while being positioned in a concentrated area of the inner circulation channels CC3 and CC4. Therefore, the temperature of the center portion may be lower than that of the outer portion.

In the illustrated exemplary embodiment, in order to reduce the temperature deviation, the temperatures of the inner cooling fluids flowing into the inner circulation channels CC3 and CC4 may be higher than the temperatures of the outer cooling fluids flowing into the outer circulation channels CC1 and CC2.

Figure 9:
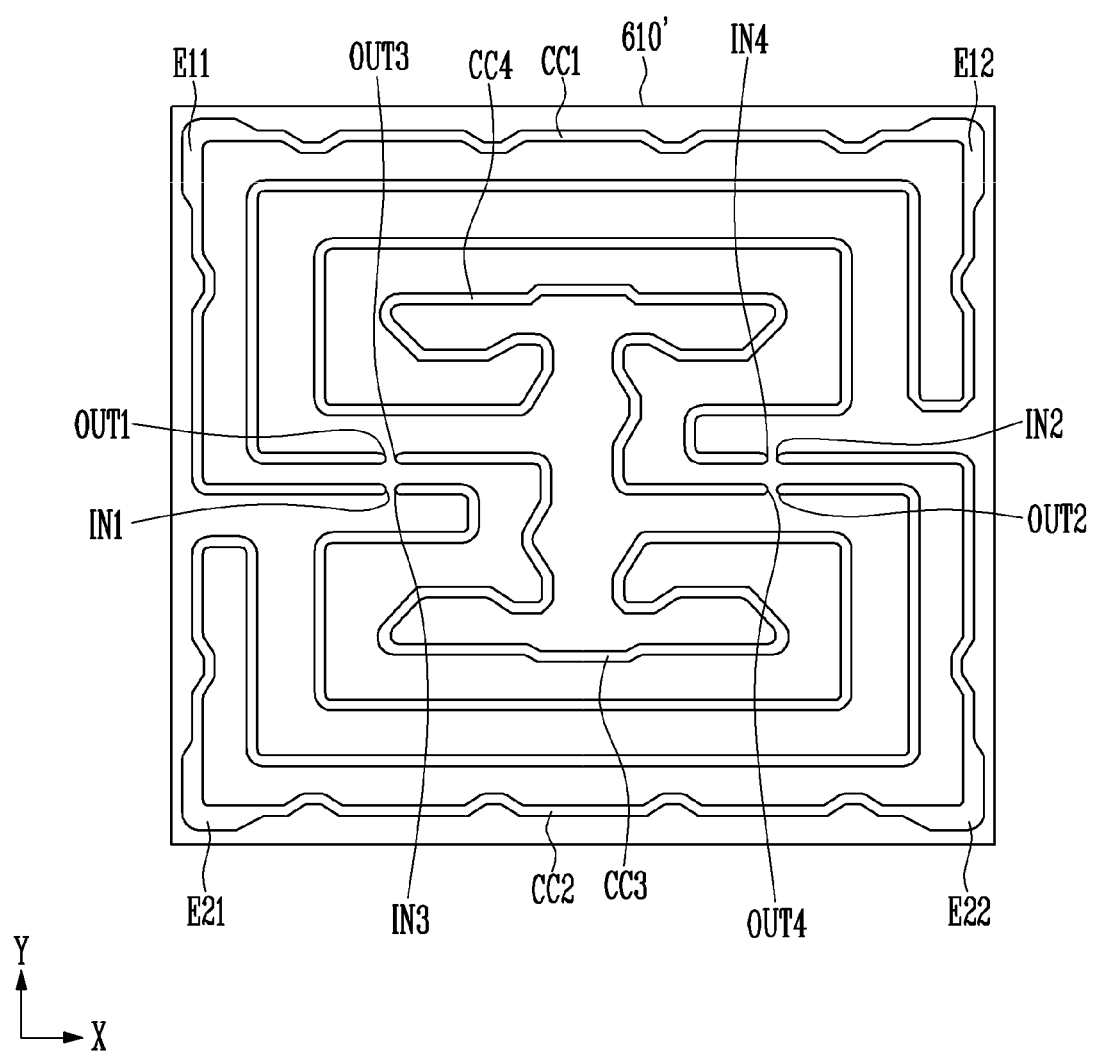
FIG. 9 is a view of a plurality of cooling channels according to another exemplary embodiment.

FIG. 9 is a view of a plurality of cooling channels according to another exemplary embodiment.

Referring to FIG. 9, outermost corners E11, E12, E21, and E22 of the outer circulation channels CC1 and CC2 have diameters greater than an average diameter of the other portions of the outer circulation channels CC1 and CC2, unlike the cooling channels shown in FIG. 8.

The outermost corners E11, E12, E21, and E22 of the outer circulation channels CC1 and CC2 are portions with the highest temperature when the inside of the chamber has an angular shape. Therefore, according to the illustrated embodiment, the cooling function for the outermost corners E11, E12, E21, and E22 may be effectively enhanced.

According to exemplary embodiments, the plasma processing device may provide a uniform plasma process on a target substrate having a large area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A plasma processing device comprising:
   a chamber;
   a plurality of dielectric windows covering a top portion of the chamber;
   a lid frame supporting the dielectric windows on a same plane;
   a plurality of supporting bars supporting a top portion of the lid frame; and
   a plurality of antennas positioned above the dielectric windows,
   wherein the antennas comprise:
   a first antenna positioned inside an area defined by the supporting bars and having a loop form; and
   a second antenna positioned outside the area defined by the supporting bars and having a loop form, and
   wherein a first current direction in the first antenna and a second current direction in the second antenna are the same as each other.

2. The plasma processing device of claim 1, wherein the first current direction and the second current direction are clockwise.

3. The plasma processing device of claim 1, wherein the first current direction and the second current direction are counterclockwise.

4. The plasma processing device of claim 1, wherein the antennas further comprise a third antenna positioned inside the first antenna and having a loop form.

5. The plasma processing device of claim 4, wherein a third current direction in the third antenna is different from the first current direction.

6. The plasma processing device of claim 5, wherein the antennas further comprise a fourth antenna positioned outside the second antenna and having a loop form.

7. The plasma processing device of claim 6, wherein a fourth current direction in the fourth antenna is different from the second current direction.

8. The plasma processing device of claim 1, further comprising:
   a plurality of exhaust ports positioned at a bottom portion of the chamber; and
   a plurality of first injection nozzles positioned vertically adjacent to the exhaust ports at the top portion of the chamber.

9. The plasma processing device of claim 8, wherein: the first injection nozzles are grouped, each group being connected to a same injection channel; and each group of the first injection nozzles corresponds to each of the exhaust ports.

10. The plasma processing device of claim 1, further comprising a plurality of injection nozzles positioned at a portion of the dielectric windows.

11. The plasma processing device of claim 10, wherein the injection nozzles comprise a plurality of first injection nozzles positioned at a plurality of first dielectric windows positioned at an outermost edge of the dielectric windows.

12. The plasma processing device of claim 11, wherein the injection nozzles further comprise a plurality of second injection nozzles positioned at a plurality of second dielectric windows positioned adjacent to a center portion of the chamber.

13. The plasma processing device of claim 11, wherein the first injection nozzles are arranged in a loop form along an array of the first dielectric windows.

14. The plasma processing device of claim 12, wherein the second injection nozzles are arranged along at least two parallel straight lines.

15. The plasma processing device of claim 1, further comprising:
   a plurality of exhaust ports positioned at the chamber; and
   a target substrate positioned inside the exhaust ports in a plan view.

16. The plasma processing device of claim 15, wherein:
   the target substrate comprises a using area and a non-using area; and
   an opening ratio of a first exhaust port adjacent to the non-using area is greater than an opening ratio of a second exhaust port adjacent to the using area.

17. The plasma processing device of claim 16, wherein the second exhaust port is positioned at an inner corner adjacent to the using area, among a plurality of inner corners of the chamber.

18. The plasma processing device of claim 1, further comprising:
   a target substrate; and
   a plurality of cooling channels positioned between a bottom wall of the chamber and the target substrate.

19. The plasma processing device of claim 18, wherein the cooling channels comprise:
   an inner circulation channel; and
   an outer circulation channel positioned outside the inner circulation channel.

20. The plasma processing device of claim 19, wherein a temperature of an inner cooling fluid flowing into the inner circulation channel is higher than a temperature of an outer cooling fluid flowing into the outer circulation channel.

21. The plasma processing device of claim 20, wherein an inlet port of the inner circulation channel and an inlet port of the outer circulation channel are positioned in a concentrated area of the inner circulation channel.

22. The plasma processing device of claim 19, wherein an outermost corner of the outer circulation channel has a diameter greater than an average diameter of remaining portions of the outer circulation channel.

* * * * *